US010510386B1

(12) United States Patent
Chang et al.

(10) Patent No.: US 10,510,386 B1
(45) Date of Patent: Dec. 17, 2019

(54) DYNAMIC BIT-LINE CLAMPING CIRCUIT FOR COMPUTING-IN-MEMORY APPLICATIONS AND CLAMPING METHOD THEREOF

(71) Applicant: NATIONAL TSING HUA UNIVERSITY, Hsinchu (TW)

(72) Inventors: Meng-Fan Chang, Taichung (TW); Wei-Hao Chen, Yunlin County (TW); Wei-Yu Lin, Taipei (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 16/115,582

(22) Filed: Aug. 29, 2018

(51) Int. Cl.
*G11C 7/12* (2006.01)
*G11C 7/06* (2006.01)

(52) U.S. Cl.
CPC . *G11C 7/12* (2013.01); *G11C 7/06* (2013.01)

(58) Field of Classification Search
None
See application file for complete search history.

(56) References Cited

U.S. PATENT DOCUMENTS

2006/0120174 A1* 6/2006 Chou ............... G11C 7/12
365/189.06

* cited by examiner

*Primary Examiner* — James G Norman
(74) *Attorney, Agent, or Firm* — CKC & Partners Co., LLC

(57) ABSTRACT

A dynamic bit-line clamping circuit for computing-in-memory applications is configured to clamp a bit line via at least one reference signal and includes a clamping node, a first clamping unit, a second clamping unit, a first feedback controlling unit and a second feedback controlling unit. The first clamping unit is electrically connected between the bit line and the clamping node. The second clamping unit is electrically connected between the clamping node and a power source voltage and includes a switch. The second feedback controlling unit is electrically connected to the clamping node and the switch. The second feedback controlling unit generates a switching signal according to the at least one reference signal and a voltage level of the clamping node. The switch is switched by the switching signal so as to clamp the voltage level of the clamping node according to the at least one reference signal.

20 Claims, 8 Drawing Sheets

US 10,510,386 B1

DYNAMIC BIT-LINE CLAMPING CIRCUIT FOR COMPUTING-IN-MEMORY APPLICATIONS AND CLAMPING METHOD THEREOF

BACKGROUND

Technical Field

The present disclosure relates to a bit-line clamping circuit and a clamping method thereof. More particularly, the present disclosure relates to a dynamic bit-line clamping circuit for computing-in-memory applications and a clamping method thereof.

Description of Related Art

In these years, due to the industrial growth of mobile device, medical electrical equipment, portable storage, etc., requirement of memory with low power, high speed and high density is increased. For computing in memory, a large number of word lines (WL) are activated at same time. Various input patterns cause a widely bit-line (BL) current distribution which leads lower control of BL clamping voltage in current sensing. The BL current distribution of computational results (multiply-and-accumulate (MAC) value) is dependent on the various input patterns. However, in a conventional BL clamping scheme, most BL voltages are clamped by one transistor and one feedback control circuit. The current range of corresponding voltage is limited by the conventional BL clamping scheme. Therefore, a dynamic bit-line clamping circuit for computing-in-memory applications and a clamping method thereof having the features of dynamically clamping the BL voltage to induce accurate currents in the widely BL current distribution are commercially desirable.

SUMMARY

According to one aspect of the present disclosure, a dynamic bit-line clamping circuit for computing-in-memory applications is configured to clamp a bit line via at least one reference signal. The dynamic bit-line clamping circuit for the computing-in-memory applications includes a clamping node, a first clamping unit, a second clamping unit, a first feedback controlling unit and a second feedback controlling unit. The first clamping unit is electrically connected between the bit line and the clamping node. The second clamping unit is electrically connected between the clamping node and a power source voltage. The second clamping unit includes a first top transistor, a second top transistor and a switch. The first top transistor is electrically connected between the clamping node and the power source voltage. The second top transistor is electrically connected between the clamping node and the power source voltage. The switch is electrically connected between the clamping node and the second top transistor. The first feedback controlling unit is electrically connected to the first clamping unit and the bit line. The first feedback controlling unit generates a controlling signal to control the first clamping unit according to a voltage level of the bit line. The second feedback controlling unit is electrically connected to the clamping node and the switch. The second feedback controlling unit generates a switching signal according to the at least one reference signal and a voltage level of the clamping node. The switch is switched by the switching signal so as to clamp the voltage level of the clamping node according to the at least one reference signal.

According to another aspect of the present disclosure, a dynamic bit-line clamping circuit for computing-in-memory applications is configured to clamp a bit line via at least one reference signal. The dynamic bit-line clamping circuit for the computing-in-memory applications includes a master portion, a second feedback controlling unit and a slave portion. The master portion includes a clamping node, a first clamping unit, a second clamping unit and a first feedback controlling unit. The first clamping unit is electrically connected between the bit line and the clamping node. The second clamping unit is electrically connected between the clamping node and a power source voltage. The second clamping unit includes a first top transistor, a second top transistor and a switch. The first top transistor is electrically connected between the clamping node and the power source voltage. The second top transistor is electrically connected between the clamping node and the power source voltage. The switch is electrically connected between the clamping node and the second top transistor. The first feedback controlling unit is electrically connected to the first clamping unit and the bit line. The first feedback controlling unit generates a controlling signal to control the first clamping unit according to a voltage level of the bit line. The second feedback controlling unit is electrically connected to the clamping node and the switch. The second feedback controlling unit generates a switching signal according to the at least one reference signal and a voltage level of the clamping node. The slave portion is electrically connected to the master portion and has a slave clamping node. The slave portion generates a voltage level of the slave clamping node according to the voltage level of the clamping node and the switching signal. The switch is switched by the switching signal so as to clamp the voltage level of the clamping node and the voltage level of the slave clamping node according to the at least one reference signal.

According to further another aspect of the present disclosure, a clamping method of the dynamic bit-line clamping circuit for the computing-in-memory applications provides a voltage level applying step, a first clamping step and a second clamping step. The voltage level applying step is for applying a voltage level to the switching signal according to the at least one reference signal and the voltage level of the clamping node. The first clamping step is for driving the first clamping unit and the first feedback controlling unit to clamp the voltage level of the bit line. The second clamping step is for driving the second clamping unit and the second feedback controlling unit to clamp the voltage level of the clamping node.

BRIEF DESCRIPTION OF THE DRAWINGS

The present disclosure can be more fully understood by reading the following detailed description of the embodiment, with reference made to the accompanying drawings as follows.

DETAILED DESCRIPTION

Before describing any embodiments in detail, some terms used in the following are described. A voltage level of "1" represents that the voltage is equal to a power source voltage VDD. The voltage level of "0" represents that the voltage is equal to a ground voltage. A PMOS transistor and an NMOS transistor represent a P-type MOS transistor and an N-type MOS transistor, respectively.

Figure 1:
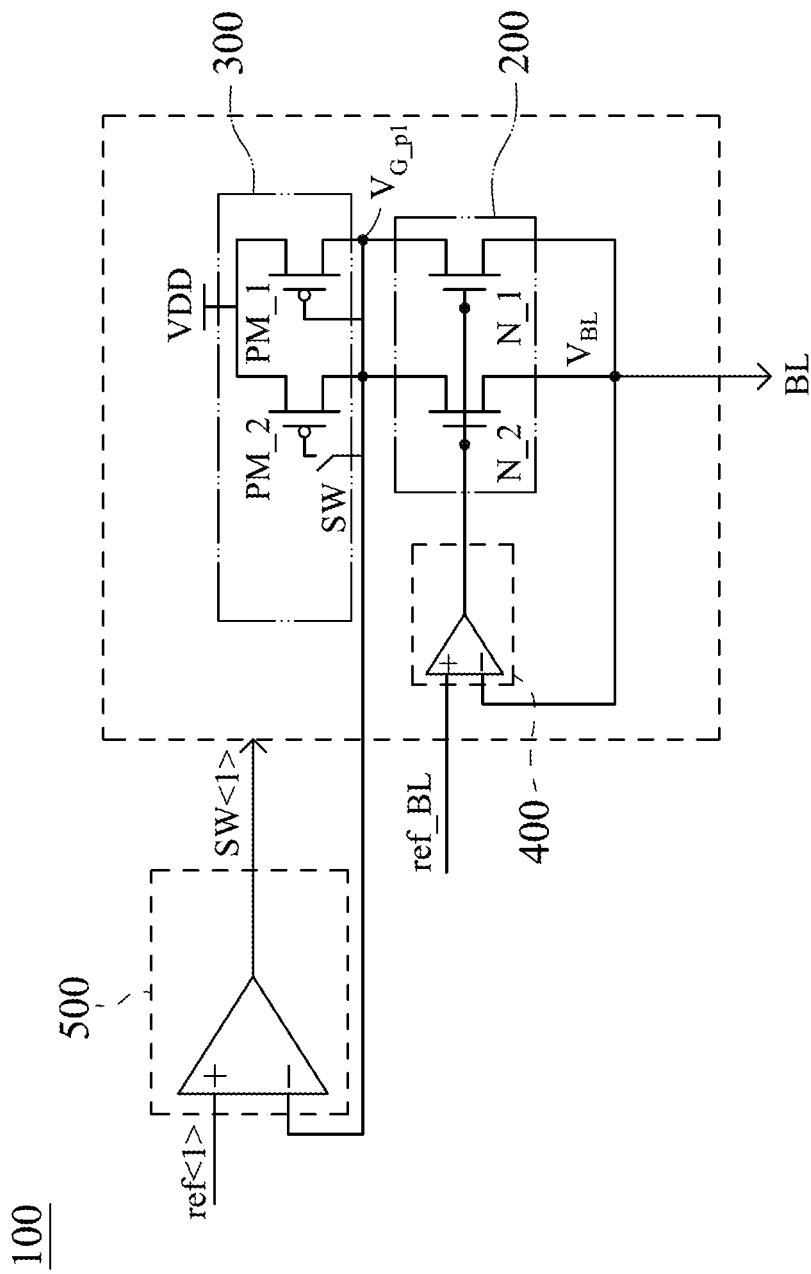
FIG. 1 shows a block diagram of a dynamic bit-line clamping circuit for computing-in-memory applications according to a first embodiment of the present disclosure.

FIG. 1 shows a block diagram of a dynamic bit-line clamping circuit 100 for computing-in-memory applications according to a first embodiment of the present disclosure. The dynamic bit-line clamping circuit 100 for the computing-in-memory applications is configured to clamp a bit line BL via at least one reference signal REF<1>. The dynamic bit-line clamping circuit 100 for computing-in-memory applications includes a clamping node $V_{G\_p1}$, a first clamping unit 200, a second clamping unit 300, a first feedback controlling unit 400 and a second feedback controlling unit 500.

The first clamping unit 200 is electrically connected between the bit line BL and the clamping node $V_{G\_p1}$. In detail, the first clamping unit 200 includes a first bottom transistor N_1 and a second bottom transistor N_2. The first bottom transistor N_1 is an NMOS transistor and has a first bottom gate, a first bottom drain and a first bottom source. The first bottom gate is coupled to the controlling signal. The first bottom drain is coupled to the clamping node $V_{G\_p1}$, and the first bottom source is coupled to the bit line BL. The second bottom transistor N_2 is an NMOS transistor and has a second bottom gate, a second bottom drain and a second bottom source. The second bottom gate is coupled to the controlling signal. The second bottom drain is coupled to the clamping node $V_{G\_p1}$, and the second bottom source is coupled to the bit line BL.

The second clamping unit 300 is electrically connected between the clamping node $V_{G\_p1}$ and the power source voltage VDD. The second clamping unit 300 includes a first top transistor PM_1, a second top transistor PM_2 and a switch SW. The first top transistor PM_1 is electrically connected between the clamping node $V_{G\_p1}$ and the power source voltage VDD. The second top transistor PM_2 is electrically connected between the clamping node $V_{G\_p1}$ and the power source voltage VDD. The switch SW is electrically connected between the clamping node $V_{G\_p1}$ and the second top transistor PM_2. In detail, the first top transistor PM_1 is a PMOS transistor and has a first top gate, a first top drain and a first top source. The first top gate and the first top drain are coupled to the clamping node $V_{G\_p1}$, and the first top source is coupled to the power source voltage VDD. The second top transistor PM_2 is a PMOS transistor and has a second top gate, a second top drain and a second top source. The second top gate is coupled to the switch SW. The second top drain is coupled to the clamping node $V_{G\_p1}$, and the second top source is coupled to the power source voltage VDD.

The first feedback controlling unit 400 is electrically connected to the first clamping unit 200 and the bit line BL. The first feedback controlling unit 400 generates a controlling signal to control the first clamping unit 200 according to a voltage level $V_{BL}$ of the bit line BL. The controlling signal is coupled to the first bottom gate of the first bottom transistor N_1 and the second bottom gate of the second bottom transistor N_2. In one embodiment, the first feedback controlling unit 400 may be implemented as a sense amplifier to feedback control the first clamping unit 200 according to a bit-line reference signal ref_BL, thereby effectively controlling the voltage level $V_{BL}$ of the bit line BL.

The second feedback controlling unit 500 is electrically connected to the clamping node $V_{G\_p1}$ and the switch SW. The second feedback controlling unit 500 generates a switching signal SW<1> according to the at least one reference signal REF<1> and a voltage level of the clamping node $V_{G\_p1}$. The switch SW is switched by the switching signal SW<1> so as to clamp the voltage level of the clamping node $V_{G\_p1}$ according to the at least one reference signal REF<1>. When a voltage level of the switching signal SW<1> is equal to zero, the second top gate is coupled to the power source voltage VDD via the switch SW. On the contrary, when the voltage level of the switching signal SW<1> is equal to one, the second top gate is coupled to the clamping node $V_{G\_p1}$ via the switch SW. The second feedback controlling unit 500 may be implemented as a sense amplifier to feedback control the second clamping unit 300 according to the reference signal REF<1>, thus effectively controlling the voltage level of the clamping node $V_{G\_p1}$. Therefore, the dynamic bit-line clamping circuit 100 of the present disclosure utilizes a dynamically configurable bit-line clamping scheme with automatically changeable configurations with a readout result from a prior cycle and a current read cycle, so that the dynamic bit-line clamping circuit 100 of the present disclosure is suitable for the computing-in-memory applications.

Figure 2:
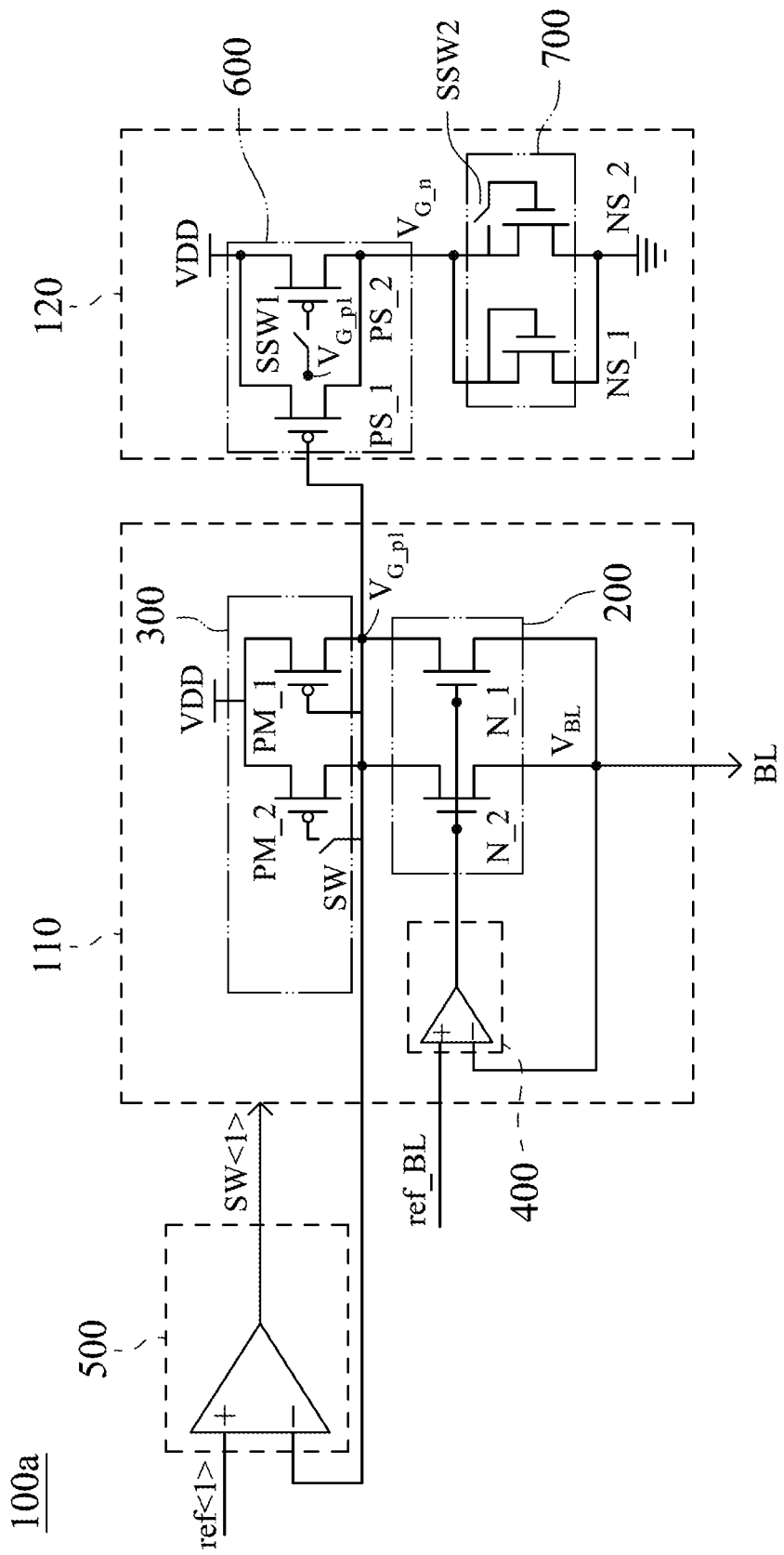
FIG. 2 shows a block diagram of a dynamic bit-line clamping circuit for computing-in-memory applications according to a second embodiment of the present disclosure.

FIG. 2 shows a block diagram of a dynamic bit-line clamping circuit 100a for computing-in-memory applications according to a second embodiment of the present disclosure. The dynamic bit-line clamping circuit 100a for computing-in-memory applications is configured to clamp a bit line via at least one reference signal REF<1> and includes a master portion 110, a second feedback controlling unit 500 and a slave portion 120.

The master portion 110 includes a clamping node $V_{G\_p1}$, a first clamping unit 200, a second clamping unit 300 and a first feedback controlling unit 400. In FIG. 2, the detail of the clamping node $V_{G\_p1}$, the first clamping unit 200, the second clamping unit 300 and the first feedback controlling unit 400 and the second feedback controlling unit 500 is the same as the embodiments of FIG. 1, and will not be described again herein. In FIG. 2, the dynamic bit-line clamping circuit 100a for the computing-in-memory applications further includes the slave portion 120. The slave portion 120 is electrically connected to the master portion 110 and has a slave clamping node $V_{G\_n}$. The slave portion 120 generates a voltage level of the slave clamping node $V_{G\_n}$ according to the voltage level of the clamping node $V_{G\_p1}$ and the switching signal SW<1>. The switch SW is switched by the switching signal SW<1> so as to clamp the voltage level of the clamping node $V_{G\_p1}$ and the voltage level of the slave clamping node $V_{G\_n}$ according to the at least one reference signal REF<1>. In detail, the slave portion 120 includes a first slave unit 600 and a second slave unit 700. The first slave unit 600 is electrically connected between the power source voltage VDD and the slave clamping node $V_{G\_n}$ and includes a first slave top transistor PS_1, a first slave switch SSW1 and a second slave top transistor PS_2. The first slave top transistor PS_1 is a PMOS transistor and has a first slave top gate, a first slave top drain and a first slave top source. The first slave top gate is coupled to the clamping node $V_{G\_p1}$. The first slave top drain is coupled to the slave clamping node $V_{G\_n}$, and the first slave top source is coupled to the power source voltage VDD. The first slave switch SSW1 is coupled to the clamping node $V_{G\_p1}$ and controlled by the switching signal SW<1>. The second slave top transistor PS_2 is a PMOS transistor and has a second slave top gate, a second slave top drain and a second slave top source. The second slave top gate is coupled to the first slave switch SSW1. The second slave top drain is coupled to the slave clamping node $V_{G\_n}$, and the second slave top source is coupled to the power source voltage VDD. In addition, the second slave unit 700 is electrically connected between the slave clamping node $V_{G\_n}$ and the ground voltage and includes a first slave bottom transistor NS_1, a second slave switch SSW2 and a second slave bottom transistor NS_2. The first slave bottom transistor NS_1 is an NMOS transistor and has a first slave bottom gate, a first slave bottom drain and a first slave bottom source. The first slave bottom gate and the first slave bottom drain are coupled to the slave clamping node $V_{G\_n}$, and the first slave bottom source is coupled to the ground voltage. The second slave switch SSW2 is coupled to the slave clamping node $V_{G\_n}$ and controlled by the switching signal SW<1>. The second slave bottom transistor NS_2 is an NMOS transistor and has a second slave bottom gate, a second slave bottom drain and a second slave bottom source. The second slave bottom gate is coupled to the second slave switch SSW2. The second slave bottom drain is coupled to the slave clamping node $V_{G\_n}$, and the second slave bottom source is coupled to the ground voltage. Accordingly, the dynamic bit-line clamping circuit 100a of the present disclosure utilizes a dynamically configurable bit-line clamping scheme with automatically changeable configurations with a readout result from a prior cycle and a current read cycle, so that the dynamic bit-line clamping circuit 100a of the present disclosure is suitable for the computing-in-memory applications. Furthermore, the slave portion 120 of the present disclosure utilizes a current mirror scheme to generate the voltage level of the slave clamping node $V_{G\_n}$ according to the voltage level of the clamping node $V_{G\_p1}$, so that the voltage level of the slave clamping node $V_{G\_n}$ can be used by a subsequent circuit to avoid disturbing the clamping node $V_{G\_p1}$.

Figure 3:
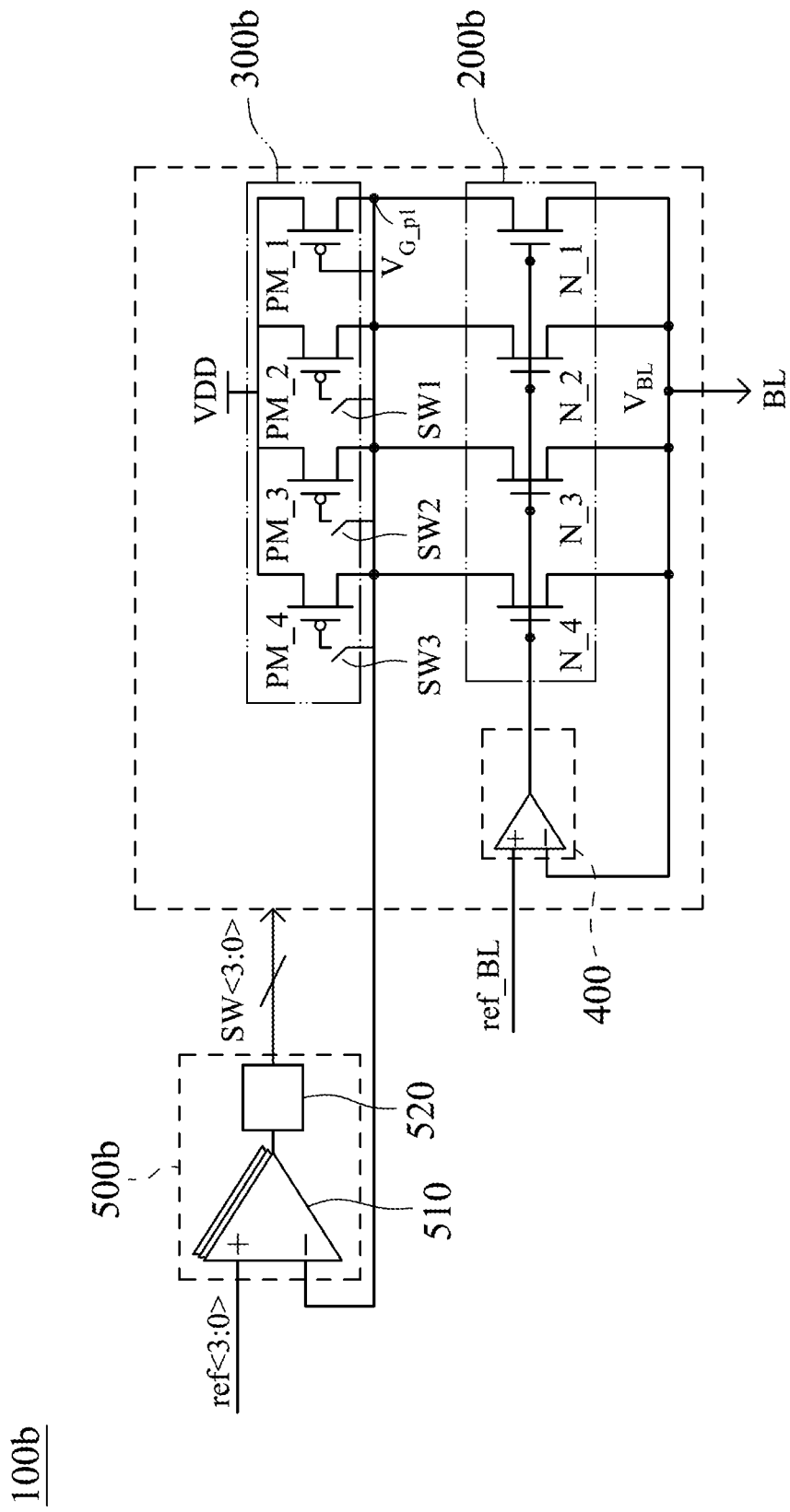
FIG. 3 shows a block diagram of a dynamic bit-line clamping circuit for computing-in-memory applications according to a third embodiment of the present disclosure.

FIG. 3 shows a block diagram of a dynamic bit-line clamping circuit 100b for computing-in-memory applications according to a third embodiment of the present disclosure. The dynamic bit-line clamping circuit 100b for the computing-in-memory applications is configured to clamp a bit line BL via a plurality of reference signals REF<3:0>. The dynamic bit-line clamping circuit 100b for the computing-in-memory applications includes a clamping node $V_{G\_p1}$, a first clamping unit 200b, a second clamping unit 300b, a first feedback controlling unit 400 and a second feedback controlling unit 500b.

The first clamping unit 200b is electrically connected between the bit line BL and the clamping node $V_{G\_p1}$. The first clamping unit 200b includes a first bottom transistor N_1, a second bottom transistor N_2, a third bottom transistor N_3 and a fourth bottom transistor N_4. In FIG. 3, the detail of the first bottom transistor N_1 and the second bottom transistor N_2 is the same as the embodiments of FIG. 1, and will not be described again herein. The third bottom transistor N_3 is an NMOS transistor and has a third bottom gate, a third bottom drain and a third bottom source. The third bottom gate is coupled to the controlling signal. The third bottom drain is coupled to the clamping node $V_{G\_p1}$, and the third bottom source is coupled to the bit line BL. The fourth bottom transistor N_4 is an NMOS transistor and has a fourth bottom gate, a fourth bottom drain and a fourth bottom source. The fourth bottom gate is coupled to the controlling signal. The fourth bottom drain is coupled to the clamping node $V_{G\_p1}$, and the fourth bottom source is coupled to the bit line BL.

The second clamping unit 300b is electrically connected between the clamping node $V_{G\_p1}$ and the power source voltage VDD. The second clamping unit 300b includes a first top transistor PM_1, a second top transistor PM_2, a third top transistor PM_3, a fourth top transistor PM_4, a first switch SW1, a second switch SW2 and a third switch SW3. The second switch SW1 is electrically connected to the clamping node $V_{G\_p1}$ and the second top transistor PM_2. The second switch SW2 is electrically connected to the clamping node $V_{G\_p1}$ and the third top transistor PM_3. The third switch SW3 is electrically connected to the clamping node $V_{G\_p1}$ and the fourth top transistor PM_4. In FIG. 3, the detail of the first top transistor PM_1 and the second top transistor PM_2 is the same as the embodiments of FIG. 1, and will not be described again herein. The third top transistor PM_3 is a PMOS transistor and has a third top gate, a third top drain and a third top source. The third top gate is coupled to the second switch SW2. The third top drain is coupled to the clamping node $V_{G\_p1}$, and the third top source is coupled to the power source voltage VDD. The fourth top transistor PM_4 is a PMOS transistor and has a fourth top gate, a fourth top drain and a fourth top source. The fourth top gate is coupled to the third switch SW3. The fourth top drain is coupled to the clamping node $V_{G\_p1}$, and the fourth top source is coupled to the power source voltage VDD.

The first feedback controlling unit 400 is electrically connected to the first clamping unit 200b and the bit line BL. The first feedback controlling unit 400 generates a controlling signal to control the first clamping unit 200b according to a voltage level $V_{BL}$ of the bit line BL. The controlling signal is coupled to the first bottom gate of the first bottom transistor N_1, the second bottom gate of the second bottom transistor N_2, the third bottom gate of the third bottom transistor N_3 and the fourth bottom gate of the fourth bottom transistor N_4. In one embodiment, the first feedback controlling unit 400 may be implemented as a sense amplifier to feedback control the first clamping unit 200b according to a bit-line reference signal ref_BL, thereby effectively controlling the voltage level $V_{BL}$ of the bit line BL. Accordingly, the third bottom gate of the third bottom transistor N_3 and the fourth bottom gate of the fourth bottom transistor N_4 may be decoupled for shorter stable time on the first bottom gate of the first bottom transistor N_1 and the second bottom gate of the second bottom transistor N_2.

The second feedback controlling unit 500b is electrically connected to the clamping node $V_{G\_p1}$, the first switch SW1, the second switch SW2 and the third switch SW3. A plurality of reference signals REF<3:0> are transmitted into the second feedback controlling unit 500b. The second feedback controlling unit 500b generates a plurality of switching signals SW<3:0> according to differences between the reference signals REF<3:0> and the voltage level of the clamping node $V_{G\_p1}$. The switching signals SW<3:0> include a first switching signal SW<1>, a second switching signal SW<2> and a third switching signal SW<3> which are correspondingly coupled to the first switch SW1, the second switch SW2 and the third switch SW3, respectively. When a voltage level of the first switching signal SW<1> is equal to zero, the second top gate is coupled to the power source voltage VDD via the first switch SW1. When the voltage level of the first switching signal SW<1> is equal to one, the second top gate is coupled to the clamping node $V_{G\_p1}$ via the first switch SW1. When a voltage level of the second switching signal SW<2> is equal to zero, the third top gate is coupled to the power source voltage VDD via the second switch SW2. When the voltage level of the second switching signal SW<2> is equal to one, the third top gate is coupled to the clamping node $V_{G\_p1}$ via the second switch SW2. When a voltage level of the third switching signal SW<3> is equal to zero, the fourth top gate is coupled to the power source voltage VDD via the third switch SW3. When the voltage level of the third switching signal SW<3> is equal to one, the fourth top gate is coupled to the clamping node $V_{G\_p1}$ via the third switch SW3. In addition, the second feedback controlling unit 500b includes a plurality of sense amplifiers 510 and a digital logic controller 520. The sense amplifiers 510 are configured to receive the reference signals REF<3:0>. The sense amplifiers 510 are electrically connected to the clamping node $V_{G\_p1}$ and generate a plurality of sensing output signals, respectively. The digital logic controller 520 is electrically connected among the sense amplifiers 510 and the second clamping unit 300b. The digital logic controller 520 generates the switching signals SW<3:0> according to the sensing output signals. In one embodiment, the digital logic controller 520 may be implemented as a decoder to correctly generate the switching signals SW<3:0>.

Figure 4:
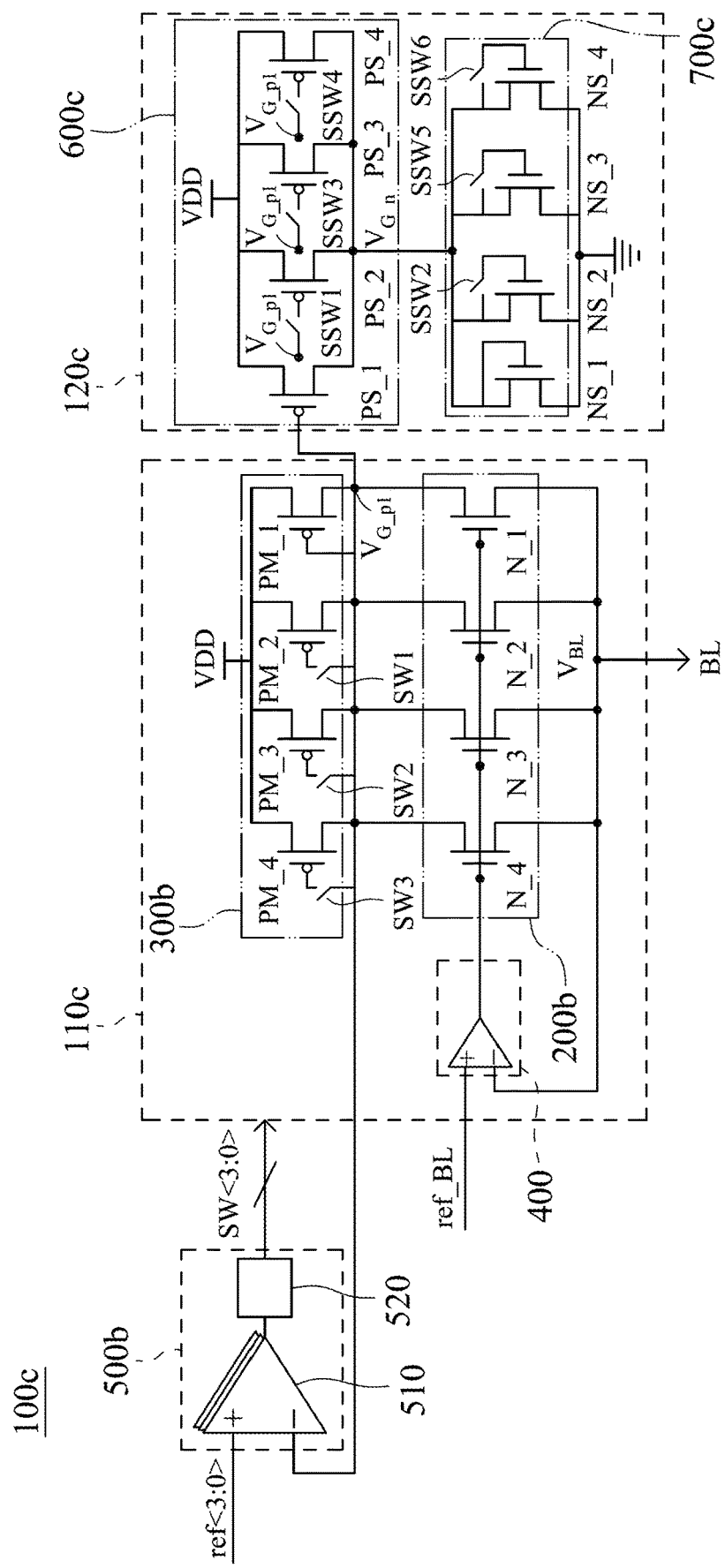
FIG. 4 shows a block diagram of a dynamic bit-line clamping circuit for computing-in-memory applications according to a fourth embodiment of the present disclosure.

FIG. 4 shows a block diagram of a dynamic bit-line clamping circuit 100c for computing-in-memory applications according to a fourth embodiment of the present disclosure. The dynamic bit-line clamping circuit 100c for the computing-in-memory applications is configured to clamp a bit line BL via a plurality of reference signals REF<3:0> and includes a master portion 110c, a second feedback controlling unit 500b and a slave portion 120c.

The master portion 110c includes a clamping node $V_{G\_p1}$, a first clamping unit 200b, a second clamping unit 300b and a first feedback controlling unit 400. In FIG. 4, the detail of the clamping node $V_{G\_p1}$, a first clamping unit 200b, a second clamping unit 300b, a first feedback controlling unit 400 and the second feedback controlling unit 500b is the same as the embodiments of FIG. 3, and will not be described again herein. In FIG. 4, the dynamic bit-line clamping circuit 100c for the computing-in-memory applications further includes the slave portion 120c. The slave portion 120 is electrically connected to the master portion 110c and has a slave clamping node $V_{G\_n}$. The slave portion 120c generates a voltage level of the slave clamping node $V_{G\_n}$ according to the voltage level of the clamping node $V_{G\_p1}$ and the switching signals SW<3:0>. The first switch SW1, the second switch SW2 and the third switch SW3 are switched by the first switching signal SW<1>, the second switching signal SW<2> and the third switching signal SW<3>, respectively, thereby effectively clamping the voltage level of the clamping node $V_{G\_p1}$ and the voltage level of the slave clamping node $V_{G\_n}$ according to the reference signals REF<3:0>.

In detail, the slave portion 120c includes a first slave unit 600c and a second slave unit 700c. The first slave unit 600c is electrically connected between the power source voltage VDD and the slave clamping node $V_{G\_n}$ and includes a first slave top transistor PS_1, a second slave top transistor PS_2, a third slave top transistor PS_3, a fourth slave top transistor PS_4, a first slave switch SSW1, a third slave switch SSW3 and a fourth slave switch SSW4. In FIG. 4, the detail of the first slave top transistor PS_1, the second slave top transistor PS_2 and the first slave switch SSW1 is the same as the embodiments of FIG. 2, and will not be described again herein. The third slave top transistor PS_3 is a PMOS transistor and has a third slave top gate, a third slave top drain and a third slave top source. The third slave top gate is coupled to the third slave switch SSW3. The third slave top drain is coupled to the slave clamping node $V_{G\_n}$, and the third slave top source is coupled to the power source voltage VDD. The fourth slave top transistor PS_4 is a PMOS transistor and has a fourth slave top gate, a fourth slave top drain and a fourth slave top source. The fourth slave top gate is coupled to the fourth slave switch SSW4. The fourth slave top drain is coupled to the slave clamping node $V_{G\_n}$, and the fourth slave top source is coupled to the power source voltage VDD. The third slave switch SSW3 is coupled between the clamping node $V_{G\_p1}$ and the third slave top gate and controlled by the second switching signal SW<2>. The fourth slave switch SSW4 is coupled between the clamping node $V_{G\_p1}$ and the fourth slave top gate and controlled by the third switching signal SW<3>. In addition, the second slave unit 700c is electrically connected between the slave clamping node $V_{G\_n}$ and the ground voltage and includes a first slave bottom transistor NS_1, a second slave bottom transistor NS_2, a third slave bottom transistor NS_3, a fourth slave bottom transistor NS_4, a second slave switch SSW2, a fifth slave switch SSW5 and a sixth slave switch SSW6. In FIG. 4, the detail of the first slave bottom transistor NS_1, the second slave bottom transistor NS_2 and the second slave switch SSW2 is the same as the embodiments of FIG. 2, and will not be described again herein. The third slave bottom transistor NS_3 is an NMOS transistor and has a third slave bottom gate, a third slave bottom drain and a third slave bottom source. The third slave bottom gate is coupled to the fifth slave switch SSW5. The third slave bottom drain is coupled to the slave clamping node $V_{G\_n}$, and the third slave bottom source is coupled to the ground voltage. The fourth slave bottom transistor NS_4 is an NMOS transistor and has a fourth slave bottom gate, a fourth slave bottom drain and a fourth slave bottom source. The fourth slave bottom gate is coupled to the sixth slave switch SSW6. The fourth slave bottom drain is coupled to the slave clamping node $V_{G\_n}$, and the fourth slave bottom source is coupled to the ground voltage. The fifth slave switch SSW5 is coupled between the slave clamping node $V_{G\_n}$ and the third slave bottom gate and controlled by the second switching signal SW<2>. The sixth slave switch SSW6 is coupled between the slave clamping node $V_{G\_n}$ and the fourth slave bottom gate and controlled by the third switching signal SW<3>. Therefore, the dynamic bit-line clamping circuit 100c of the present disclosure utilizes a dynamically configurable bit-line clamping scheme with automatically changeable configurations with a readout result from a prior cycle and a current read cycle, so that the dynamic bit-line clamping circuit 100c of the present disclosure is suitable for the computing-in-memory applications. Moreover, the slave portion 120c of the present disclosure utilizes a current mirror scheme to generate the voltage level of the slave clamping node $V_{G\_n}$ according to the voltage level of the clamping node $V_{G\_p1}$, so that the voltage level of the slave clamping node $V_{G\_n}$ can be used by a subsequent circuit to avoid disturbing the clamping node $V_{G\_p1}$. The current mirror scheme can reconfigure currents of PMOS transistors according to the current flow through.

Figure 5:
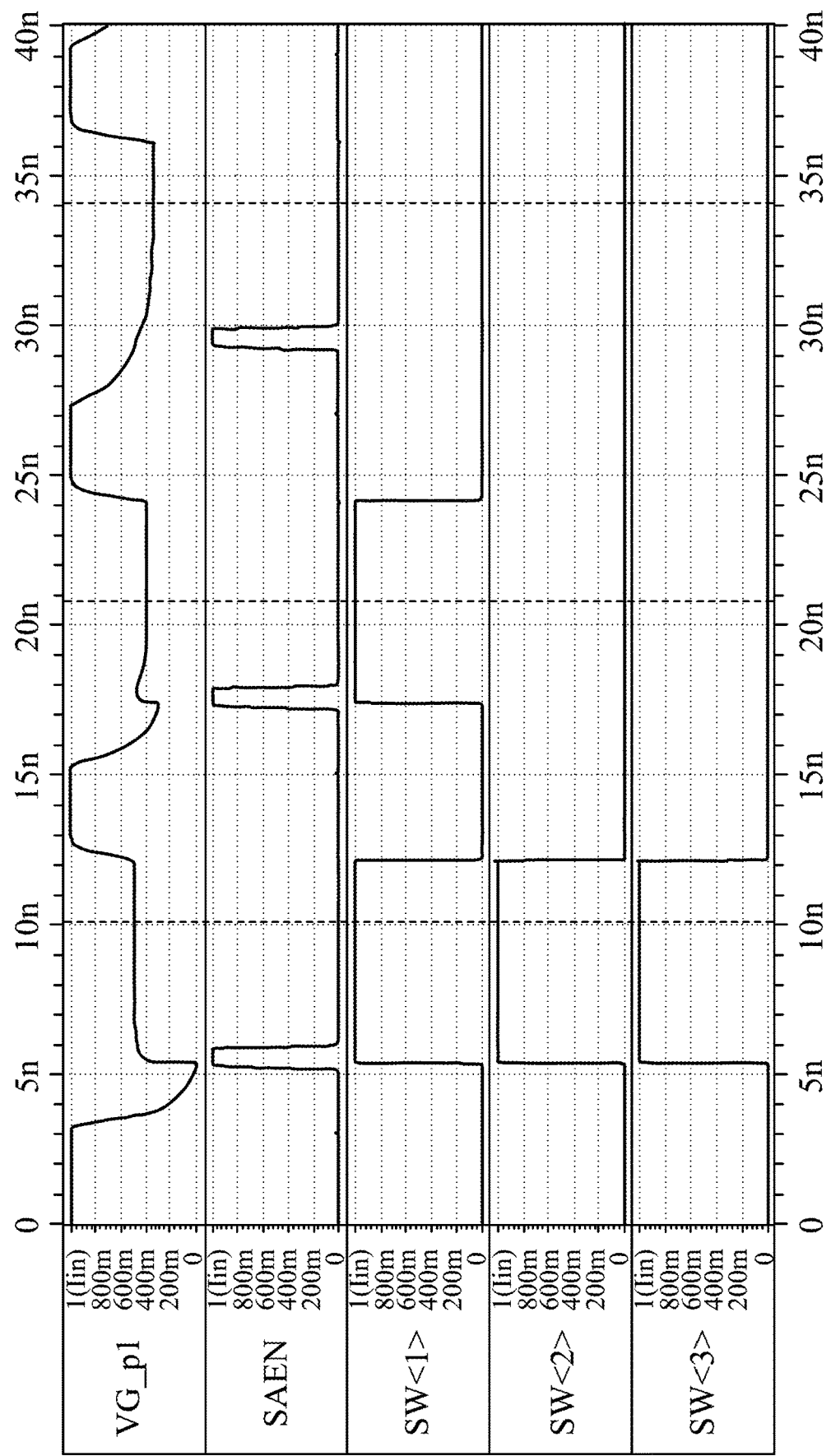
FIG. 5 shows timing diagrams of the dynamic bit-line clamping circuit for the computing-in-memory applications of FIG. 4.

FIG. 5 shows timing diagrams of the dynamic bit-line clamping circuit 100c for the computing-in-memory applications of FIG. 4. It is obvious that the unselected PMOS transistor(s) (i.e., the second top transistor PM_2, the third top transistor PM_3 and/or the fourth top transistor PM_4) will be turned off according to the first switch SW1, the second switch SW2 and the third switch SW3 switched by the first switching signal SW<1>, the second switching signal SW<2> and the third switching signal SW<3>, respectively. The voltage level of the clamping node $V_{G\_p1}$ can be effectively clamped according to the first switching signal SW<1>, the second switching signal SW<2> and the third switching signal SW<3> in a read cycle.

Figure 6:
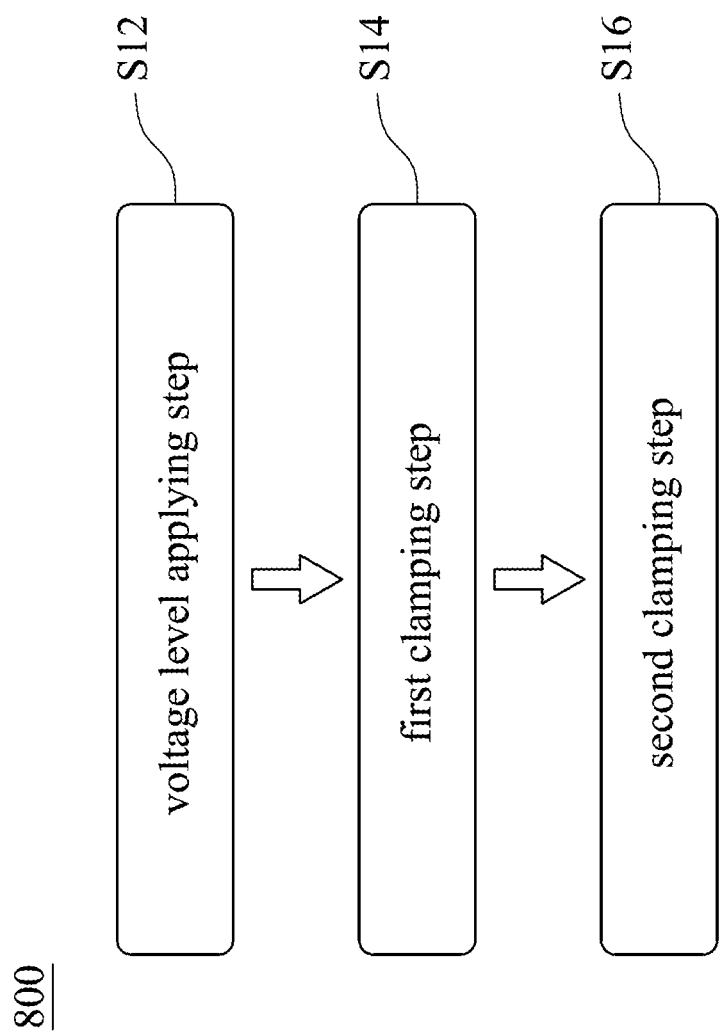
FIG. 6 shows a flow chart of a clamping method of the dynamic bit-line clamping circuit for the computing-in-memory applications of FIG. 1 according to one embodiment of the present disclosure.

FIG. 6 shows a flow chart of a clamping method 800 of the dynamic bit-line clamping circuit 100 for the computing-in-memory applications of FIG. 1 according to one embodiment of the present disclosure. The clamping method 800 provides a voltage level applying step S12, a first clamping step S14 and a second clamping step S16. The voltage level applying step S12 is for applying a voltage level to the switching signal SW<1> according to the at least one reference signal REF<1> and the voltage level of the clamping node $V_{G\_p1}$. The first clamping step S14 is for driving the first clamping unit 200 and the first feedback controlling unit 400 to clamp the voltage level of the bit line BL. The second clamping step S16 is for driving the second clamping unit 300 and the second feedback controlling unit 500 to clamp the voltage level of the clamping node $V_{G\_p1}$. Certainly, the clamping method 800 may be applied to the dynamic bit-line clamping circuit 100b for the computing-in-memory applications of FIG. 3. Therefore, the clamping method 800 of the present disclosure utilizes a dynamically configurable bit-line clamping scheme with automatically changeable configurations with a readout result from a prior cycle and a current read cycle, so that the dynamic bit-line clamping circuits 100, 100b of the present disclosure are suitable for the computing-in-memory applications.

Figure 7:
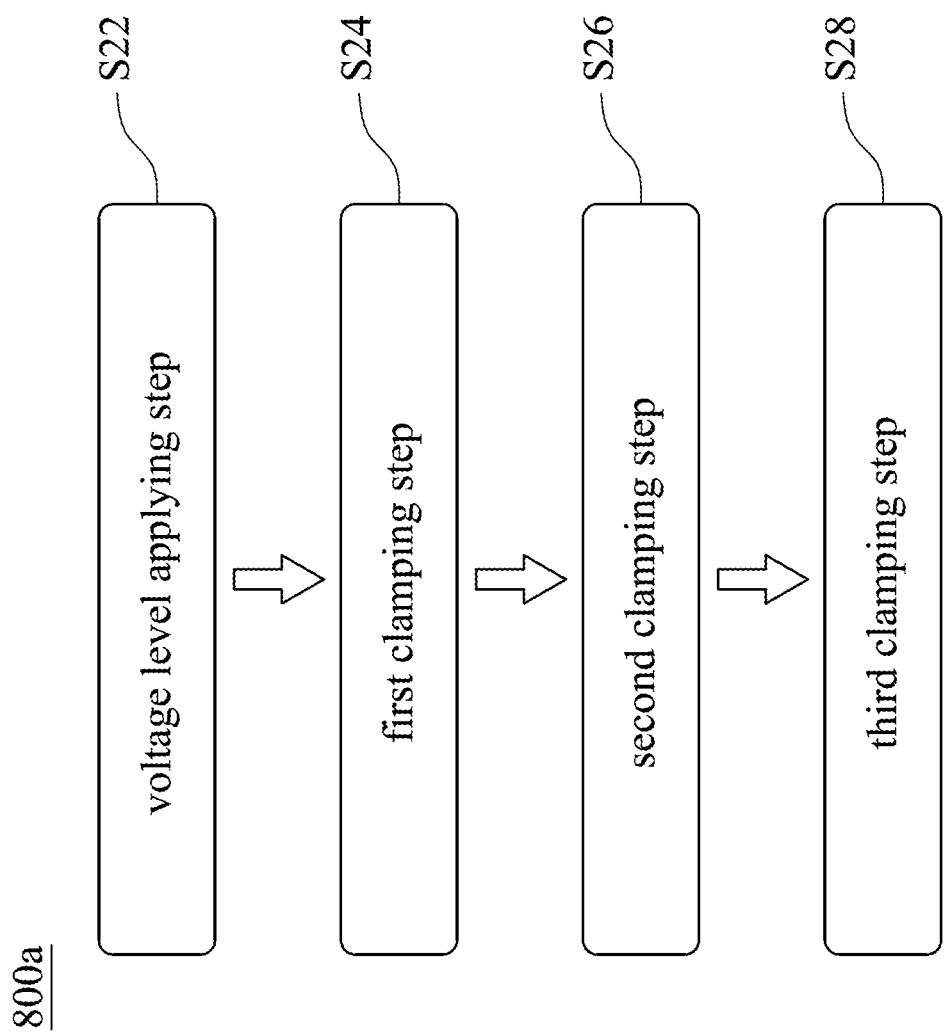
FIG. 7 shows a flow chart of a clamping method of the dynamic bit-line clamping circuit for the computing-in-memory applications of FIG. 4 according to another embodiment of the present disclosure.

FIG. 7 shows a flow chart of a clamping method 800a of the dynamic bit-line clamping circuit 100c for the computing-in-memory applications of FIG. 4 according to another embodiment of the present disclosure. The clamping method 800a provides a voltage level applying step S22, a first clamping step S24, a second clamping step S26 and a third clamping step S28.

The voltage level applying step S22 is for applying a plurality of voltage levels to the first switching signal SW<1>, the second switching signal SW<2> and the third switching signal SW<3> according to the reference signal REF<3:0> and the voltage level of the clamping node $V_{G\_p1}$. The first clamping step S24 is for driving the first clamping unit 200b and the first feedback controlling unit 400 to clamp the voltage level of the bit line BL.

The second clamping step S26 is for driving the second clamping unit 300b and the second feedback controlling unit 500b to clamp the voltage level of the clamping node $V_{G\_p1}$. In detail, when the voltage level of the first switching signal SW<1> is equal to zero, the second top gate of the second top transistor PM_2 is coupled to the power source voltage VDD via the first switch SW1. When the voltage level of the first switching signal SW<1> is equal to one, the second top gate is coupled to the clamping node $V_{G\_p1}$ via the first switch SW1. When the voltage level of the second switching signal SW<2> is equal to zero, the third top gate of the third top transistor PM_3 is coupled to the power source voltage VDD via the second switch SW2. When the voltage level of the second switching signal SW<2> is equal to one, the third top gate is coupled to the clamping node $V_{G\_p1}$ via the second switch SW2. When a voltage level of the third switching signal SW<3> is equal to zero, the fourth top gate of the fourth top transistor PM_4 is coupled to the power source voltage VDD via the third switch SW3. When the voltage level of the third switching signal SW<3> is equal to one, the fourth top gate is coupled to the clamping node $V_{G\_p1}$ via the third switch SW3.

The third clamping step S28 is for driving the slave portion 120c to clamp a voltage level of the slave clamping node $V_{G\_n}$ according to the voltage level of the clamping node $V_{G\_p1}$, the first switching signal SW<1>, the second switching signal SW<2> and the third switching signal SW<3>. The slave portion 120c is electrically connected to the clamping node $V_{G\_p1}$. Certainly, the clamping method 800a may be applied to the dynamic bit-line clamping circuit 100a for the computing-in-memory applications of FIG. 2. Hence, the clamping method 800a of the present disclosure utilizes a dynamically configurable bit-line clamping scheme with automatically changeable configurations with a readout result from a prior cycle and a current read cycle, so that the dynamic bit-line clamping circuits 100a, 100c of the present disclosure are suitable for the computing-in-memory applications. Furthermore, the third clamping step S28 of the present disclosure utilizes a current mirror scheme to generate the voltage level of the slave clamping node $V_{G\_n}$ according to the voltage level of the clamping node $V_{G\_p1}$, so that the voltage level of the slave clamping node $V_{G\_n}$ can be used by a subsequent circuit to avoid disturbing the clamping node $V_{G\_p1}$.

Figure 8:
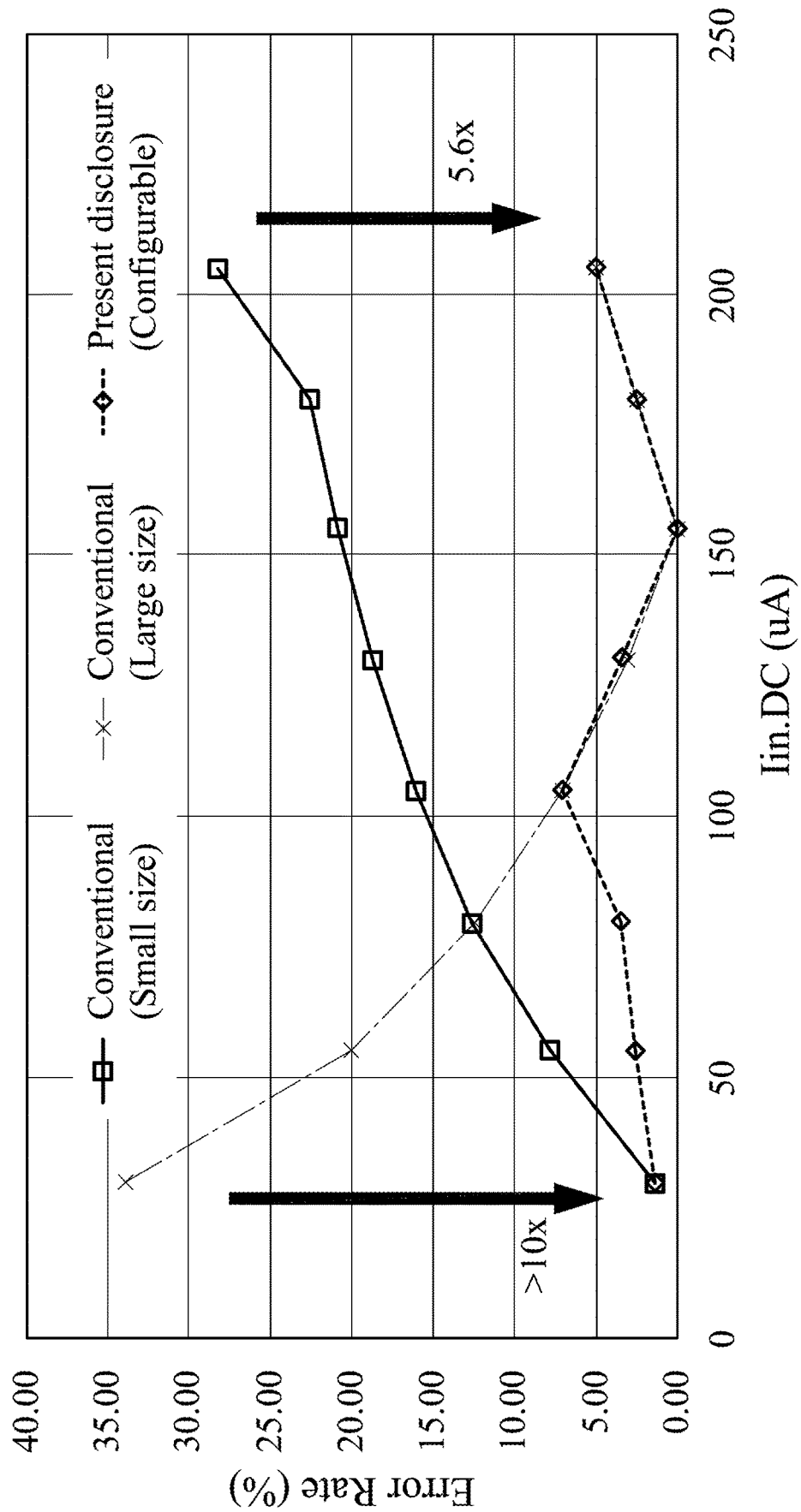
FIG. 8 shows a comparison result of error rates between the clamping method of the present disclosure and conventional methods.

FIG. 8 shows a comparison result of error rates between the clamping method 800 of the present disclosure and conventional methods. The clamping method 800 is applied to the dynamic bit-line clamping circuit 100b for the computing-in-memory applications of FIG. 3. The conventional methods include a small-size conventional method and a large-size conventional method. The small-size conventional method represents that only one small-size MOS transistor is utilized in the conventional bit-line clamping circuit. The large-size conventional method represents that only one large-size MOS transistor is utilized in the conventional bit-line clamping circuit. The clamping method 800 of the present disclosure represents that the second clamping unit 300b of the dynamic bit-line clamping circuit 100b utilizes a plurality of small-size MOS transistors (e.g., the first top transistor PM_1, the second top transistor PM_2, the third top transistor PM_3 and the fourth top transistor PM_4 in FIG. 3). The horizontal axis "Iin, DC" represents DC currents of the bit line BL. Therefore, the comparison result shows that the clamping method 800 of the present disclosure can effectively improve the error rates of the conventional methods via the dynamically configurable bit-line clamping scheme in the widely bit-line current distribution.

According to the aforementioned embodiments and examples, the advantages of the present disclosure are described as follows.

1. The dynamic bit-line clamping circuit of the present disclosure utilizes a dynamically configurable bit-line clamping scheme with automatically changeable configurations with a readout result from a prior cycle and a current read cycle, so that the dynamic bit-line clamping circuit of the present disclosure is suitable for the computing-in-memory applications.

2. The slave portion of the present disclosure utilizes a current mirror scheme to generate the voltage level of the slave clamping node according to the voltage level of the clamping node, so that the voltage level of the slave clamping node can be used by a subsequent circuit to avoid disturbing the clamping node.

3. The current mirror scheme of the present disclosure can reconfigure currents of PMOS transistors according to the current flow through.

4. The clamping method of the present disclosure can effectively improve the error rates of the conventional methods via the dynamically configurable bit-line clamping scheme in the widely bit-line current distribution.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A dynamic bit-line clamping circuit for computing-in-memory applications, which is configured to clamp a bit line via at least one reference signal, and the dynamic bit-line clamping circuit for the computing-in-memory applications comprising:
   a clamping node;
   a first clamping unit electrically connected between the bit line and the clamping node;
   a second clamping unit electrically connected between the clamping node and a power source voltage, and the second clamping unit comprising:
      a first top transistor electrically connected between the clamping node and the power source voltage;
      a second top transistor electrically connected between the clamping node and the power source voltage; and
      a switch electrically connected between the clamping node and the second top transistor;
   a first feedback controlling unit electrically connected to the first clamping unit and the bit line, wherein the first feedback controlling unit generates a controlling signal to control the first clamping unit according to a voltage level of the bit line; and
   a second feedback controlling unit electrically connected to the clamping node and the switch, wherein the second feedback controlling unit generates a switching signal according to the at least one reference signal and a voltage level of the clamping node;
   wherein the switch is switched by the switching signal so as to clamp the voltage level of the clamping node according to the at least one reference signal.

2. The dynamic bit-line clamping circuit for the computing-in-memory applications of claim 1, wherein the first clamping unit comprises:
   a first bottom transistor having a first bottom gate, a first bottom drain and a first bottom source, wherein the first bottom gate is coupled to the controlling signal, the first bottom drain is coupled to the clamping node, and the first bottom source is coupled to the bit line; and
   a second bottom transistor having a second bottom gate, a second bottom drain and a second bottom source, wherein the second bottom gate is coupled to the controlling signal, the second bottom drain is coupled to the clamping node, and the second bottom source is coupled to the bit line.

3. The dynamic bit-line clamping circuit for the computing-in-memory applications of claim 2, wherein,
   the first top transistor has a first top gate, a first top drain and a first top source, wherein the first top gate and the first top drain are coupled to the clamping node, and the first top source is coupled to the power source voltage; and
   the second top transistor has a second top gate, a second top drain and a second top source, wherein the second top gate is coupled to the switch, the second top drain is coupled to the clamping node, and the second top source is coupled to the power source voltage;
   wherein when a voltage level of the switching signal is equal to zero, the second top gate is coupled to the power source voltage via the switch; when the voltage level of the switching signal is equal to one, the second top gate is coupled to the clamping node via the switch.

4. The dynamic bit-line clamping circuit for the computing-in-memory applications of claim 3, wherein the first clamping unit further comprises:
   a third bottom transistor having a third bottom gate, a third bottom drain and a third bottom source, wherein the third bottom gate is coupled to the controlling signal, the third bottom drain is coupled to the clamping node, and the third bottom source is coupled to the bit line; and
   a fourth bottom transistor having a fourth bottom gate, a fourth bottom drain and a fourth bottom source, wherein the fourth bottom gate is coupled to the controlling signal, the fourth bottom drain is coupled to the clamping node, and the fourth bottom source is coupled to the bit line.

5. The dynamic bit-line clamping circuit for the computing-in-memory applications of claim 4, wherein the switch is represented as a first switch, the second clamping unit further comprises a third top transistor, a fourth top transistor, a second switch and a third switch, the second switch is electrically connected to the clamping node and the third top transistor, and the third switch is electrically connected to the clamping node and the fourth top transistor;
   wherein the third top transistor has a third top gate, a third top drain and a third top source, wherein the third top gate is coupled to the second switch, the third top drain is coupled to the clamping node, and the third top source is coupled to the power source voltage;
   wherein the fourth top transistor has a fourth top gate, a fourth top drain and a fourth top source, wherein the fourth top gate is coupled to the third switch, the fourth top drain is coupled to the clamping node, and the fourth top source is coupled to the power source voltage.

6. The dynamic bit-line clamping circuit for the computing-in-memory applications of claim 5, wherein a plurality of reference signals are transmitted into the second feedback controlling unit, the second feedback controlling unit generates a plurality of switching signals according to differences between the reference signals and the voltage level of the clamping node, the switching signals comprise a first switching signal, a second switching signal and a third switching signal which are correspondingly coupled to the first switch, the second switch and the third switch, respectively;

wherein when a voltage level of the first switching signal is equal to zero, the second top gate is coupled to the power source voltage via the first switch; when the voltage level of the first switching signal is equal to one, the second top gate is coupled to the clamping node via the first switch;

wherein when a voltage level of the second switching signal is equal to zero, the third top gate is coupled to the power source voltage via the second switch; when the voltage level of the second switching signal is equal to one, the third top gate is coupled to the clamping node via the second switch;

wherein when a voltage level of the third switching signal is equal to zero, the fourth top gate is coupled to the power source voltage via the third switch; when the voltage level of the third switching signal is equal to one, the fourth top gate is coupled to the clamping node via the third switch.

7. The dynamic bit-line clamping circuit for the computing-in-memory applications of claim 6, wherein the second feedback controlling unit comprises:

a plurality of sense amplifiers configured to receive the reference signals, wherein the sense amplifiers are electrically connected to the clamping node and generate a plurality of sensing output signals, respectively; and a digital logic controller electrically connected among the sense amplifiers and the second clamping unit, wherein the digital logic controller generates the switching signals according to the sensing output signals.

8. A clamping method of the dynamic bit-line clamping circuit for the computing-in-memory applications of claim 1, comprising:

providing a voltage level applying step, wherein the voltage level applying step is for applying a voltage level to the switching signal according to the at least one reference signal and the voltage level of the clamping node;

providing a first clamping step, wherein the first clamping step is for driving the first clamping unit and the first feedback controlling unit to clamp the voltage level of the bit line; and providing a second clamping step, wherein the second clamping step is for driving the second clamping unit and the second feedback controlling unit to clamp the voltage level of the clamping node.

9. The clamping method of claim 8, wherein, in the second clamping step, the switch is represented as a first switch, the second clamping unit further comprises a third top transistor, a fourth top transistor, a second switch and a third switch, the second switch is electrically connected between the clamping node and the third top transistor, the third switch is electrically connected between the clamping node and the fourth top transistor, a plurality of reference signals are transmitted into the second feedback controlling unit, the second feedback controlling unit generates a first switching signal, a second switching signal and a third switching signal according to the reference signals and the voltage level of the clamping node, and the first switch, the second switch and the third switch are correspondingly switched by the first switching signal, the second switching signal and the third switching signal, respectively.

10. The clamping method of claim 9, wherein, in the second clamping step, when a voltage level of the first switching signal is equal to zero, a second top gate of the second top transistor is coupled to the power source voltage via the first switch; when the voltage level of the first switching signal is equal to one, the second top gate is coupled to the clamping node via the first switch;

wherein when a voltage level of the second switching signal is equal to zero, a third top gate of the third top transistor is coupled to the power source voltage via the second switch; when the voltage level of the second switching signal is equal to one, the third top gate is coupled to the clamping node via the second switch;

wherein when a voltage level of the third switching signal is equal to zero, a fourth top gate of the fourth top transistor is coupled to the power source voltage via the third switch; when the voltage level of the third switching signal is equal to one, the fourth top gate is coupled to the clamping node via the third switch.

11. The clamping method of claim 10, wherein, in the second clamping step, a plurality of sense amplifiers are configured to receive the reference signals and generate a plurality of sensing output signals, respectively, and a digital logic controller generates the first switching signal, the second switching signal and the third switching signal according to the sensing output signals.

12. The clamping method of claim 8, further comprising:

providing a third clamping step, wherein the third clamping step is for driving a slave portion to clamp a voltage level of the slave clamping node according to the voltage level of the clamping node and the switching signal, and the slave portion is electrically connected to the clamping node.

13. A dynamic bit-line clamping circuit for computing-in-memory applications, which is configured to clamp a bit line via at least one reference signal, and the dynamic bit-line clamping circuit for the computing-in-memory applications comprising:

a master portion comprising:
      a clamping node;
      a first clamping unit electrically connected between the bit line and the clamping node;
      a second clamping unit electrically connected between the clamping node and a power source voltage, and the second clamping unit comprising:
         a first top transistor electrically connected between the clamping node and the power source voltage;
         a second top transistor electrically connected between the clamping node and the power source voltage; and
         a switch electrically connected between the clamping node and the second top transistor; and
      a first feedback controlling unit electrically connected to the first clamping unit and the bit line, wherein the first feedback controlling unit generates a controlling signal to control the first clamping unit according to a voltage level of the bit line;

a second feedback controlling unit electrically connected to the clamping node and the switch, wherein the second feedback controlling unit generates a switching signal according to the at least one reference signal and a voltage level of the clamping node; and a slave portion electrically connected to the master portion and having a slave clamping node, wherein the slave portion generates a voltage level of the slave clamping node according to the voltage level of the clamping node and the switching signal;

wherein the switch is switched by the switching signal so as to clamp the voltage level of the clamping node and the voltage level of the slave clamping node according to the at least one reference signal.

14. The dynamic bit-line clamping circuit for the computing-in-memory applications of claim 13, wherein the slave portion comprises:
 a first slave unit electrically connected between the power source voltage and the slave clamping node, and comprising:
  a first slave top transistor having a first slave top gate, a first slave top drain and a first slave top source, wherein the first slave top gate is coupled to the clamping node, the first slave top drain is coupled to the slave clamping node, and the first slave top source is coupled to the power source voltage;
  a first slave switch coupled to the clamping node and controlled by the switching signal; and
  a second slave top transistor having a second slave top gate, a second slave top drain and a second slave top source, wherein the second slave top gate is coupled to the first slave switch, the second slave top drain is coupled to the slave clamping node, and the second slave top source is coupled to the power source voltage; and
 a second slave unit electrically connected between the slave clamping node and a ground voltage, and comprising:
  a first slave bottom transistor having a first slave bottom gate, a first slave bottom drain and a first slave bottom source, wherein the first slave bottom gate and the first slave bottom drain are coupled to the slave clamping node, and the first slave bottom source is coupled to the ground voltage;
  a second slave switch coupled to the slave clamping node and controlled by the switching signal; and
  a second slave bottom transistor having a second slave bottom gate, a second slave bottom drain and a second slave bottom source, wherein the second slave bottom gate is coupled to the second slave switch, the second slave bottom drain is coupled to the slave clamping node, and the second slave bottom source is coupled to the ground voltage.

15. The dynamic bit-line clamping circuit for the computing-in-memory applications of claim 13, wherein the first clamping unit comprises:
 a first bottom transistor having a first bottom gate, a first bottom drain and a first bottom source, wherein the first bottom gate is coupled to the controlling signal, the first bottom drain is coupled to the clamping node, and the first bottom source is coupled to the bit line; and
 a second bottom transistor having a second bottom gate, a second bottom drain and a second bottom source, wherein the second bottom gate is coupled to the controlling signal, the second bottom drain is coupled to the clamping node, and the second bottom source is coupled to the bit line.

16. The dynamic bit-line clamping circuit for the computing-in-memory applications of claim 15, wherein,
 the first top transistor has a first top gate, a first top drain and a first top source, the first top gate and the first top drain are coupled to the clamping node, and the first top source is coupled to the power source voltage; and
 the second top transistor has a second top gate, a second top drain and a second top source, the second top gate is coupled to the switch, the second top drain is coupled to the clamping node, and the second top source is coupled to the power source voltage;
 wherein when a voltage level of the switching signal is equal to zero, the second top gate is coupled to the power source voltage via the switch; when the voltage level of the switching signal is equal to one, the second top gate is coupled to the clamping node via the switch.

17. The dynamic bit-line clamping circuit for the computing-in-memory applications of claim 16, wherein the first clamping unit further comprises:
 a third bottom transistor having a third bottom gate, a third bottom drain and a third bottom source, wherein the third bottom gate is coupled to the controlling signal, the third bottom drain is coupled to the clamping node, and the third bottom source is coupled to the bit line; and
 a fourth bottom transistor having a fourth bottom gate, a fourth bottom drain and a fourth bottom source, wherein the fourth bottom gate is coupled to the controlling signal, the fourth bottom drain is coupled to the clamping node, and the fourth bottom source is coupled to the bit line.

18. The dynamic bit-line clamping circuit for the computing-in-memory applications of claim 17, wherein the switch is represented as a first switch, the second clamping unit further comprises a third top transistor, a fourth top transistor, a second switch and a third switch, the second switch is electrically connected to the clamping node and the third top transistor, and the third switch is electrically connected to the clamping node and the fourth top transistor;
 wherein the third top transistor has a third top gate, a third top drain and a third top source, wherein the third top gate is coupled to the second switch, the third top drain is coupled to the clamping node, and the third top source is coupled to the power source voltage;
 wherein the fourth top transistor has a fourth top gate, a fourth top drain and a fourth top source, wherein the fourth top gate is coupled to the third switch, the fourth top drain is coupled to the clamping node, and the fourth top source is coupled to the power source voltage.

19. The dynamic bit-line clamping circuit for the computing-in-memory applications of claim 18, wherein a plurality of reference signals are transmitted into the second feedback controlling unit, the second feedback controlling unit generates a plurality of switching signals according to differences between the reference signals and the voltage level of the clamping node, the switching signals comprise a first switching signal, a second switching signal and a third switching signal which are correspondingly coupled to the first switch, the second switch and the third switch, respectively;
 wherein when a voltage level of the first switching signal is equal to zero, the second top gate is coupled to the power source voltage via the first switch; when the voltage level of the first switching signal is equal to one, the second top gate is coupled to the clamping node via the first switch;
 wherein when a voltage level of the second switching signal is equal to zero, the third top gate is coupled to the power source voltage via the second switch; when the voltage level of the second switching signal is equal to one, the third top gate is coupled to the clamping node via the second switch;

wherein when a voltage level of the third switching signal is equal to zero, the fourth top gate is coupled to the power source voltage via the third switch; when the voltage level of the third switching signal is equal to one, the fourth top gate is coupled to the clamping node via the third switch.

20. The dynamic bit-line clamping circuit for the computing-in-memory applications of claim 19, wherein the second feedback controlling unit comprises:

a plurality of sense amplifiers configured to receive the reference signals, wherein the sense amplifiers are electrically connected to the clamping node and generate a plurality of sensing output signals, respectively; and a digital logic controller electrically connected among the sense amplifiers and the second clamping unit, wherein the digital logic controller generates the switching signals according to the sensing output signals.

* * * * *